United States Patent [19]

Sato et al.

[11] Patent Number: 5,753,421

[45] Date of Patent: May 19, 1998

US005753421A

[54] STOCK DEVELOPER SOLUTIONS FOR PHOTORESISTS AND DEVELOPER SOLUTIONS PREPARED BY DILUTION THEREOF

[75] Inventors: Mitsuru Sato; Masakazu Kobayashi; Toshimasa Nakayama, all of Kanagawa-ken, Japan

[73] Assignee: Tokyo Ohka Kogya Co., Ltd., Kawasaki, Japan

[21] Appl. No.: 412,885

[22] Filed: Mar. 29, 1995

[30] Foreign Application Priority Data

Mar. 31, 1994 [JP] Japan .................... 6-083650

[51] Int. Cl.$^6$ .................... G03F 7/30; G03F 7/32
[52] U.S. Cl. .................... 430/325; 430/326; 430/331; 252/79.5
[58] Field of Search .................... 430/331, 326, 430/325; 252/541, 545, 544, 547, 158, 79.5

[56] References Cited

U.S. PATENT DOCUMENTS

| | | | |
|---|---|---|---|
| 4,239,661 | 12/1980 | Muraoka et al. | 252/541 |
| 4,744,834 | 5/1988 | Hag | 430/331 |
| 4,873,177 | 10/1989 | Tanaka et al. | 430/331 |
| 5,175,078 | 12/1992 | Aoyama et al. | 430/331 |
| 5,185,235 | 2/1993 | Sato et al. | 430/331 |
| 5,230,988 | 7/1993 | Akiyama et al. | 430/331 |
| 5,278,030 | 1/1994 | Ingham et al. | 430/331 |
| 5,279,771 | 1/1994 | Lee | 430/331 |

FOREIGN PATENT DOCUMENTS 4-346 351  12/1992  Japan .

OTHER PUBLICATIONS

Grieco et al., IBM Technical disclosure Bulletin, vol. 13, No. 7, Dec., 1970.

*Primary Examiner*—John S. Chu
*Attorney, Agent, or Firm*—Wenderoth, Lind & Ponack

[57] ABSTRACT

Stock developer solutions for photoresists contain an organic base free from metal ions and at least one compound having a specified weight average molecular weight that is selected from among polyethylene oxide compounds, polypropylene oxide compounds and ethylene oxide/propylene oxide adducts. The stock developer solutions may be diluted to requisite concentrations to prepare developer solutions for photoresists. By adding one or more of the specified compounds to the organic base free from metal ions, one can produce highly compatible stock developer solutions for photoresists that are concentrated, that have high stability in quality and that permit ease in handling and quality control. The stock developer solutions may be diluted to prepare developer solutions that are small in the tendency to foam and effective in defoaming, that assure uniform wetting and that are capable of forming resist patterns faithful to mask patterns.

12 Claims, No Drawings

STOCK DEVELOPER SOLUTIONS FOR PHOTORESISTS AND DEVELOPER SOLUTIONS PREPARED BY DILUTION THEREOF

BACKGROUND OF THE INVENTION

1. Field of the Invention

This invention relates to stock developer solutions for photoresists and developer solutions prepared by dilution thereof. More particularly, the invention relates to highly compatible stock developer solutions for photoresists that have specified compounds added to high concentrations of organic bases free from metal ions, as well as developer solutions that are prepared by diluting said stock developer solutions, that are not only low in the tendency to foam but also effective in defoaming, that allow uniform wetting, and that are capable of developing photoresists to form patterns faithful to mask patterns.

2. Description of the Related Art

To perform etching and diffusion treatments on substrates in the fabrication of electronic components such as semiconductor and liquid-crystal devices, the substrates must be protected selectively. To this end, coatings are formed on the substrates using "radiation-sensitive" photoresists which are sensitive to actinic radiations such as ultraviolet rays, far-ultraviolet rays, excimer laser beams, X-rays and electron beams and the coatings are then exposed imagewise and developed to form image patterns, which are used as protective layers. Primarily for the purpose of assuring environmental safety, aqueous alkali solutions are commonly used as developer solutions for radiation-sensitive photoresists.

If the aqueous alkali solution used as a developer solution in the fabrication of electronic components contains metal ions, the characteristics of the device produced will be adversely affected. To avoid this problem, developer solutions in common use are formulated to contain no metal ions, as exemplified by aqueous solutions of tetramethylammonium hydroxide(TMAH; see IBM Technical Disclosure Bulletin, Vol. 13, No.7, page 2009,1970) and trimethyl(2-hydroxyethyl)ammonium hydroxide (choline; see U.S. Pat. No. 4,239,661). Developer solutions that are comprised of aqueous alkali solutions free from metal ions warrant general use since they allow for simpler procedures in storage and liquid waste treatments than organic solvent-based developer solutions and because they are not flammable and require no particular measures to insure safety.

The alkali concentration of this common type of developer solutions is typically adjusted to about 2–3 wt % and to reduce possible variations in the effective sensitivity of photoresists, adjustment to an optimal alkali concentration must be made very precisely for each of the photoresists to be developed. Such alkali concentration adjustments are conventionally performed by manufacturers of developer solutions who dilute stock developer solutions with water so that their alkali concentrations typically ranging from about 15 to 25% are lowered to requisite levels.

However, the use of developer solutions that solely contain organic bases free from metal ions causes the problem of foaming during the development of photoresists. With a view to solving this problem, various surfactants are conventionally added as required for defoaming purposes when stock developer solutions are diluted to prepare developer solutions of suitable alkali concentrations.

Due primarily to the difficulties involved in controlling the quality of stock developer solutions and adjusting the alkali concentrations of developer solutions to optimal values, the dilution of stock developer solutions has heretofore been taken care of by manufacturers of developer solutions, who dilute their products to strictly controlled, optimal alkali concentrations and supply them to users or manufacturers of electronic components. However, the recent increase in the production volume of semiconductor and liquid-crystal devices and other electronic components has caused a corresponding marked increase in the use of photoresist developer solutions. Under the circumstances, the conventional practice which depends on manufacturers of developer solutions for diluting stock developer solutions to prepare developer solutions of optimal alkali concentrations and supplying them to the users is no longer suitable since not only the manufacturers but also the users are required to keep a large number of drums in stock for containing the developer solutions. Furthermore, the cost of transporting the developer solutions is increased to cause an inevitable increase in the manufacturing cost of electronic components.

To cope with this situation, various methods have been proposed that enable the users to dilute stock developer solutions of high alkali concentrations to strictly controlled. One of such methods has been proposed by Tokyo Ohka Kogyo Co., Ltd. as a diluting system by which stock developer solutions can be easily diluted to very precise concentrations (see U.S. application Ser. No. 08/090,415, filed on Jul. 12, 1993). This system is basically a method of supplying a stock developer solution and pure water into a mixing tank, diluting the stock developer solution with pure water, and mixing them together to prepare a developer solution of a predetermined concentration. The method is characterized in that the concentration of the mixed solution being diluted is analyzed and, on the basis of the value of analysis, the weight of the stock developer solution or pure water that has to be added to the mixing tank to attain the predetermined concentration is calculated and then the stock developer solution or pure water is supplied to achieve the intended concentration adjustment. This method allows the stock developer solution to be diluted to much more precise concentrations than has been possible by the prior art method that controls the drive of a pump for feeding the stock developer solution or pure water into the mixing tank. Hence, the system under consideration enables the users to adjust the alkali concentration of developer solutions in a strict and yet simple manner.

With this system for diluting stock developer solutions being adopted increasingly by users, there is a growing need for manufacturers of developer solutions to supply stock developer solutions that are adaptive to this improved diluting system.

The stock developer solutions to be diluted by this system as well as any other systems usually contain metal ion-free organic bases in high concentrations of not less than 15–20 wt %, which will be reduced to 2–3 wt % by dilution for preparing developer solutions. However, as already mentioned, developer solutions that solely contain organic bases free from metal ions will foam during development to cause problems such as unsuitability for cyclic use of the developer solutions and incapability of supplying them in adequate amounts. Therefore, incorporating surfactants and any other necessary ingredients into solutions during dilution has been needed.

If undiluted stock developer solutions as mixed with defoaming agents could be supplied to users, they would have no need to add surfactants by themselves but may simply dilute the stock solutions with water to prepare developer solutions for photoresists having desired alkali concentrations.

In fact, however, the surfactants heretofore used in developer solutions for photoresists for defoaming are not highly compatible, so if they are incorporated in high concentrations in stock developer solutions, the alkali concentration of the latter is limited and it has been difficult to prepare stock solutions having higher alkali concentrations of not less than 20 wt %.

As a result of the intensive studies conducted to overcome these difficulties, the present inventors found compounds that were highly compatible in stock developer solutions having high alkali concentrations of not less than 15–20 wt % and which yet would not impair the developing characteristics of the developer solutions that were prepared by diluting said stock developer solutions. By incorporating such compounds, one can produce concentrated stock developer solutions that are stable in quality, that permit ease in handling and quality control and that yet are adaptive to the aforementioned diluting system. The use of such stock developer solutions eliminates the need to provide a separate step for incorporating surfactants and other necessary ingredients during dilution. At the same time, they can be easily diluted to prepare developer solutions that are not only low in the tendency to foam but also effective in defoaming, that allow uniform wetting, and that are capable of developing photoresists to form patterns faithful to mask patterns.

SUMMARY OF THE INVENTION

An object, therefore, of the present invention is to provide stock developer solutions for photoresists that have high concentrations, that are stable in quality and that insure ease in handling and quality control.

Another object of the present invention is to provide improved developer solutions for photoresists using said stock developer solutions that are not only low in the tendency to foam but also effective in defoaming, that allow uniform wetting and that are capable of developing photoresists to form patterns faithful to mask patterns.

In one aspect, the present invention relates to a stock developer solution for photoresists that has a high concentration of an organic base free from metal ions, that is to be diluted to prepare a developer solution and that also contains at least one compound having a weight average molecular weight of 100–1,000 that is selected from among polyethylene oxide compounds, polypropylene oxide compounds and ethylene oxide/propylene oxide adducts.

In another aspect, the present invention relates to a developer solution for photoresists that is prepared by diluting said stock developer solution to a requisite concentration of the organic base free from metal ions.

By adding the above specified compound to the organic base free from metal ions, one can produce stock developer solutions for photoresists that are highly compatible and that have unconventionally high alkali concentration of not less than 15–20 wt %, typically at about 30 wt %. The developer solutions of the present invention can be prepared from the stock developer solutions that are preliminarily formulated in high concentrations, that contain highly compatible compounds and that are highly stable in quality and that are low in the tendency to foam but also effective in defoaming. Therefore, once the stock developer solutions are diluted with water, there is no need to add surfactants and any other ingredients for certain purposes such as defoaming and desired developer solutions can be readily obtained.

DESCRIPTION DETAILED OF THE PREFERRED EMBODIMENTS

One of the two essential components of the invention is the organic base free from metal ions and this may be any one of those which are customarily used in developer solution of alkali-soluble photoresists, as exemplified by arylamines, alkylene amines and alkylamines containing linear, branched or cyclic primary, secondary or tertiary amines as substituents(e.g. arylamines such as 4,4'-diaminodiphenylamine, alkylenediamines such as 1,3-diaminopropane and alkylamines such as N,N'-diaminodialkylamines), as well as heterocyclic bases having a skeletal ring structure consisting of 3–5 carbon atoms and 1 or 2 heteroatoms selected from among nitrogen, oxygen and sulfur atoms (e.g. pyrrole, pyrrolidine, pyrrolidone, pyridine, morpholine, pyrazine, piperidine, oxazole and thiazole). Also usable are loweralkyl quaternary ammonium bases, specific examples of which include tetramethylammonium hydroxide(TMAH), tetraethylammonium hydroxide, tetrapropylammonium hydroxide, trimethylethylammonium hydroxide, trimethyl(2-hydroxyethyl) ammonium hydroxide(choline), triethyl(2-hydroxyethyl) ammonium hydroxide, tripropyl(2-hydroxyethyl) ammonium hydroxide and trimethyl(1-hydroxypropyl) ammonium hydroxide. Among these compounds, loweralkyl quaternary ammonium bases are preferred, with TMAH and choline being used with particular advantage.

These organic bases free from metal ions may be used either individually or in combination.

The concentration of the organic bases free from metal ions varies somewhat with their type or the photoresist to be developed. When in stock developer solution, the organic bases free from metal ions have concentrations of not less than 15–20 wt %, typically at about 30 wt %, which upon dilution may be reduced to values that are customarily used with developer solutions for photoresists, typically about 2–3 wt %.

The other essential component of the invention is at least one compound having a weight average molecular weight of 100–1,000 that is selected from among polyethylene oxide compounds, polypropylene oxide compounds and ethylene oxide/propylene oxide adducts.

Polyethylene oxide compounds include ethylene oxide adducts of $C_{1-22}$ linear, branched or cyclic alcohols or alkylphenols, as well as polyethylene glycol, with ethylene oxide adducts of $C_{1-8}$ alcohols and polyethylene glycol being used with particular advantage. Exemplary $C_{1-8}$ alcohols include linear, branched or cyclic, monohydric or dihydric alcohols, which may have substituents such as lower alkoxy groups. Specific examples include methyl alcohol, ethyl alcohol, n-propyl alcohol, isopropyl alcohol, n-butyl alcohol, isobutyl alcohol, tert-butyl alcohol, amyl alcohol, isoamyl alcohol, hexanol, cyclohexanol, octanol, acetylene alcohol, hexylene glycol, and 3-methyl-3-methoxybutylalcohol. Among these, lower alcohols such as methyl alcohol, ethyl alcohol, propyl alcohol and butyl alcohol, as well as hexylene glycol and 3-methyl-3-methoxybutyl alcohol are used with advantage.

Preferred polyethylene oxide compounds may specifically be exemplified by polyethylene glycol having a methoxy group at one terminal end of the molecule (polyoxyethylene methyl ether), polyethylene glycol having an ethoxy group at one terminal end of the molecule (polyoxyethylene ethyl ether), polyethylene glycol having a propoxy group at one terminal end of the molecule (polyoxyethylene propyl ether), polyethylene glycol having a butoxy group at one terminal end of the molecule(polyoxyethylene butyl ether), hexylene glycol/ethylene oxide adduct, and 3-methyl-3-methoxybutanol/ethylene oxide adduct.

Exemplary polypropylene oxide compounds include propylene oxide adducts of $C_{1-22}$ linear, branched or cyclic alcohols, alkylphenols or alkylnaphthols, with adducts of $C_{1-8}$ alcohols and propylene oxide being used with particular advantage. Exemplary $C_{1-8}$ alcohols include linear, branched or cyclic, monohydric or dihydric alcohols, which may have substituents such as lower alkoxy groups. Specific examples include methyl alcohol, ethyl alcohol, n-propyl alcohol, isopropyl alcohol, n-butyl alcohol, isobutyl alcohol, tert-butyl alcohol, amyl alcohol, isoamyl alcohol, hexanol, cyclohexanol, octanol, acetylene alcohol, hexylene glycol, and 3-methyl-3-methoxybutyl alcohol. Among these, lower alcohols such as methyl alcohol, ethyl alcohol, propyl alcohol and butyl alcohol, as well as hexylene glycol and 3-methyl-3-methoxybutyl alcohol are used with advantage.

Preferred polypropylene oxide compounds may specifically be exemplified by polypropylene glycol having a methoxy group at one terminal end of the molecule (polyoxypropylene methyl ether), polypropylene glycol having an ethoxy group at one terminal end of the molecule (polyoxypropylene ethyl ether), polypropylene glycol having a propoxy group at one terminal end of the molecule (polyoxypropylene propyl ether), polypropylene glycol having a butoxy group at one terminal end of the molecule (polyoxypropylene butyl ether), hexylene glycol/propylene oxide adducts, and 3-methyl-3-methoxybutanol/propylene oxide adducts.

Exemplary ethylene oxide/propylene oxide adducts include polyoxyethylene/polyoxypropylene block polymers, as well as polyoxyethylene polyoxypropylene alkyl ethers produced by addition polymerization of $C_{1-22}$ linear, branched or cyclic alcohols with ethylene oxide and propylene oxide, with $C_{1-8}$ alcohol adducts of ethylene oxide and propylene oxide being used with particular advantage. Exemplary $C_{1-8}$ alcohols include linear, branched or cyclic, monohydric or dihydric alcohols, which may have substituents such as lower alkoxy groups. Specific examples include methyl alcohol, ethyl alcohol, n-propyl alcohol, isopropyl alcohol, n-butyl alcohol, isobutyl alcohol, tert-butyl alcohol, amyl alcohol, isoamyl alcohol, hexanol, cyclohexanol, octanol, acetylene alcohol, hexylene glycol, and 3-methyl-3-methoxybutyl alcohol. Among these, hexylene glycol and 3-methyl-3-methoxybutyl alcohol are used with advantage.

Preferred ethylene oxide/propylene oxide adducts may specifically be exemplified by a hexylene glycol/ethylene oxide/propylene oxide adduct and a 3-methyl-3-methoxybutanol/ethylene oxide/propylene oxide adduct.

The compounds described above must have weight average molecular weights of 100–1,000; the preferred range is from 200 to 800, with the range of 200–600 being more preferred. If those compounds have weight average molecular weights less than 100, developer solutions having desired properties (i.e., low tendency to foam, efficient defoaming, uniform wetting and the ability to form photoresist patterns faithful to mask patterns) cannot be prepared. On the other hand, compounds having average molecular weights of not less than 1,000 are prone to form micella when they are incorporated in stock developer solutions, making the latter less stable in quality while presenting difficulties in handling and quality control.

In the present invention, two or more compounds selected from among the polyethylene oxide compounds, polypropylene oxide compounds, and ethylene oxide/propylene oxide adducts may be used in combination and, in this case, adjustments may be performed to insure that the sum of the weight average molecular weights of the two or more selected compounds lies within the range from 100 to 1,000.

Compounds that are particularly preferred for use in the present invention include: polyethylene glycols having weight average molecular weights of 200–800; polyethylene glycols having a methoxy group at one terminal end of the molecule and which have weight average molecular weights of 200–600; polyethylene glycols having an ethoxy group at one terminal end of the molecule and which have weight average molecular weights of 200–400; polyethylene glycols having a butoxy group at one terminal end of the molecule and which have weight average molecular weights of 200–400; a hexylene glycol/ethylene oxide adduct; a hexylene glycol/propylene oxide adduct; a hexylene glycol/ethylene oxide/propylene oxide adduct; a 3-methyl-3-methoxy butanol/ethylene oxide adduct; a 3-methyl-3-methoxybutanol/propylene oxide adduct; and a 3-methyl-3-methoxybutanol/ethylene oxide/propylene oxide adduct. These compounds are preferred since they have good solubility in the aforementioned stock developer solutions, from which one can prepare developer solutions that may be used to develop photoresists which exhibit a low tendency to foam and a high capability for defoaming.

The amount in which the above-described compounds should be incorporated may be determined as appropriate by the skilled artisan in accordance with the alkali concentration of the developer solution for photoresists. Typically, these compounds are added to the developer solution in amounts of 100–10,000 ppm, preferably 200–5,000 ppm. The amount of their incorporation in the stock developer solution may be derived from these ranges for the developer solution. Typically, the compounds are added to the stock developer solution in amounts of 0.06–8.4 wt %, preferably 0.2–4.0 wt %. One essential component of the present invention is the organic base that is free from metal ions and its concentration in the stock developer solution can be increased to values of not less than 15–20 wt % on account of using one or more of the compounds specified above as the other essential component of the invention. The higher the concentration of the metal ion free organic base that is present in the stock developer solution, the more the developer solution that can be prepared and, hence, the better. In this invention, the concentration of the metal ion free organic base in the stock developer solution is 15–50 wt %; the preferred range is 20–40 wt %, with the range of 20–30 wt % being more preferred.

The developer solution of the invention comprises basically the organic base free from metal ions and one or more of the compounds described hereinabove and it is prepared by diluting, just prior to use, the stock developer solution which contains the two components in comparatively increased concentrations. For dilution, the system for diluting stock developer solutions that is described in the U.S. application Ser. No. 08/090,415 may advantageously be used but, needless to say, the invention is by no means limited to this system only.

Thus, the developer solution of the invention can be prepared from stock developer solutions for photoresists that contain those compounds in high concentrations which have high stability in quality and which are yet low in the tendency to foam and effective in defoaming.

Therefore, once the stock developer solutions are diluted with water, there is no need to add surfactants and any other ingredients for certain purposes such as defoaming and desired developer solutions for photoresists can be readily obtained.

The stock developer solution of the invention for photoresists, as well as the developer solution prepared by diluting said stock developer solution may incorporate any additives that are customarily used in developer solutions for photoresists, such as various known surfactants, lubricants, stabilizers and dissolution aids, to the extent that will not impair the objects of the invention.

The photoresists to be developed with the stock developer solution and the developer solution of the invention may be negative- or positive-working as long as they are capable of development with aqueous alkali solutions. They may be exemplified by but not limited to the following:

(1) positive-working photoresists containing naphthoquinone diazide compounds and novolak resins; (2) positive-working photoresists containing compounds that generate acids upon exposure, compounds that are decomposed with acids to become more soluble in aqueous alkali solutions, and alkali-soluble resins; (3) positive-working photoresists containing compounds that generate acids upon exposure and alkali-soluble resins having groups that are decomposed with acids to become more soluble in aqueous alkali solutions; and (4) negative-working photoresists containing compounds that generate acids upon exposure, crosslinking agents and alkali-soluble resins.

We now describe an exemplary method of using the developer solution for photoresists that is prepared in accordance with the invention. It should, however, be noted that this is not the sole aspect of the invention.

The method starts with forming a photoresist layer on a substrate such as a silicon wafer or a glass plate. Then, the photoresist layer is exposed, through a predetermined mask pattern, to light sources such as a low-pressure mercury lamp, a high-pressure lamp, an ultrahigh-pressure mercury lamp, an arc lamp and a xenon lamp that emit actinic rays including ultraviolet rays, far ultraviolet rays, excimer laser beams, X-rays and electron beams. Alternatively, the photoresist layer is scanned with electron beams for illumination. Following optional post-exposure bake, the exposed photoresist layer is developed patternwise with the developer solution to produce a predetermined resist pattern. The method of development is in no way limited and various types of development can be performed in accordance with a specific object, as exemplified by dip development (in which a substrate coated with the photoresist is dipped in the developer solution for a predetermined time, rinsed with water and dried,) puddle development (in which the developer solution is spread on a surface of the applied photoresist layer, which is allowed to stand for a given time, rinsed with water and dried), and spray development (in which a surface of the photoresist layer is sprayed with the developer solution, rinsed with water and dried). A particular advantage of the invention is that the stock developer solution described hereinabove can easily be diluted to prepare developer solutions having optimal concentrations for specific photoresists to be developed. Additionally, the so prepared developer solution is suppressed against foaming during development and exhibits uniform wetting; hence, it is capable of uniform development in a wafer plane to form a photoresist pattern faithful to the mask pattern.

EXAMPLES 1–24 AND COMPARATIVE
EXAMPLES 1–4

The following examples are provided for the purpose of further illustrating the present invention but are in no way to be taken as limiting.

Samples of stock developer solution for photoresist development and those of developer solution were prepared as described below. The samples of stock developer solution were evaluated for solubility and those of developer solution were evaluated for haze, defoaming and low tendency to foam and pattern profile. The methods of the respective evaluations are described below, and the results are shown in Table 1.

Items of evaluation (1) Solubility

The compounds listed in Table 1 were each added in an amount of 2 wt % to an aqueous solution of 20.1 wt % TMAH held at 23° C. which is commonly used as a stock developer solution. The solubility of these compounds was rated by the following criteria.

◎: Dissolved very soon.
○: Took some time to dissolve.
×: Did not dissolve.

(2) Haze

The stock solution used in (1) was diluted with water to a TMAH concentration of 2.38 wt %. The concentration of each test compound was adjusted to 2,400 ppm in the diluted aqueous TMAH solution. The thus prepared developer solutions were held at 40° C. to see whether haze would occur at that temperature. "Haze" is a characteristic feature of nonionic surfactants and developer solutions in which haze occurs are no longer suitable for use.

○: No haze occurred.
×: Haze occurred.

(3) Defoaming and low tendency to foam

A photoresist composition, or OFPR-800(Tokyo Ohka Kogyo Co., Ltd.) mainly consisting of a cresol novolak resin and a naphthoquinone-1,2-diazidesulfonic acid ester compound, was coated onto a silicon wafer(6 inch$\phi$), dried, illuminated with an actinic radiation (G-line at 436 nm) through a mask having a specified pattern and thereafter processed with an aqueous solution of 2.38 wt % TMAH that had been prepared by the same procedure as described in (2). The aqueous TMAH solution had a test compound added (for its name, see Table 1) and was suitable for development of the photoresist.

Each of the thus prepared developer solutions was checked for the capability for defoaming and the low tendency to foam. To accelerate the foaming due to development, each sample solution was vibrated after processing 10 Si wafers and the time required for subsequent defoaming was measured. The results were evaluated by the following criteria:

◎: The foam disappeared completely within one minute.
○: The foam disappeared completely within ten minutes.
×: More than 10 minutes were required for the foam to disappear.

Experiments with developer solutions that had the respective ratings showed that compared to those which were rated ◎ and ○, the samples rated × had a great tendency to cause uneven development as they were used to process an increased number of Si wafers.

(4) Pattern profile

A photoresist composition of the same type as used in (3) (OFPR-800 of Tokyo Ohka Kogyo Co., Ltd.) was coated onto a Si wafer(6 inch$\phi$), dried, illuminated with an actinic radiation (G-line at 436 nm) through a mask having a predetermined pattern and thereafter processed with an aqueous solution of 2.38 wt % TMAH that had been prepared by the same procedure as described in (2). The aqueous TMAH solution had a test compound added (for its name, see Table 1) and was suitable for development of the photoresist. The resulting photoresist patterns were examined under SEM (scanning electron microscope) to evaluate the line sharpness. The criteria for rating were as follows:

○: The photoresist pattern profile was virtually rectangular.
×: With round shoulders.

TABLE 1

| Run No. | Solubility at 23° C. | Haze at 40° C. | Defoaming and low tendency to foam at 2,400 ppm | Pattern profile | Additive Compound | Mw | Mn | Mw/Mn |
|---|---|---|---|---|---|---|---|---|
| | | | | | | Measured by GPC(*) | | |
| Example | | | | | | | | |
| 1 | ○ | ○ | ◎ | ○ | $(Me)_2C(OH)-(PO)_2-H$ | 369 | 222 | 1.66 |
| 2 | ○ | ○ | ◎ | ○ | $(Me)_2C(OMe)-EO-(PO)_3-H$ | 391 | 320 | 1.22 |
| 3 | ◎ | ○ | ○ | ○ | PEG | 744 | 664 | 1.12 |
| 4 | ◎ | ○ | ◎ | ○ | PEG with —OMe at one terminal end | 294 | 242 | 1.24 |
| 5 | ◎ | ○ | ◎ | ○ | " | 506 | 440 | 1.15 |
| 6 | ◎ | ○ | ○ | ○ | " | 802 | 652 | 1.23 |
| 7 | ◎ | ○ | ◎ | ○ | PEG with —OEt at one terminal end | 320 | 273 | 1.17 |
| 8 | ◎ | ○ | ○ | ○ | " | 629 | 533 | 1.18 |
| 9 | ◎ | ○ | ○ | ○ | " | 788 | 691 | 1.14 |
| 10 | ◎ | ○ | ◎ | ○ | PEG with —OBu at one terminal end | 302 | 247 | 1.22 |
| 11 | ◎ | ○ | ○ | ○ | " | 506 | 408 | 1.24 |
| 12 | ◎ | ○ | ○ | ○ | " | 715 | 581 | 1.23 |
| 13 | ◎ | ○ | ○ | ○ | $(Me)_2C(OH)-(PO)_2-(EO)_1-H$ | 426 | 387 | 1.10 |
| 14 | ◎ | ○ | ○ | ○ | $(Me)_2C(OH)-(PO)_2-(EO)_2-H$ | 527 | 454 | 1.16 |
| 15 | ◎ | ○ | ○ | ○ | $(Me)_2C(OH)-(PO)_2-(EO)_3-H$ | 621 | 522 | 1.19 |
| 16 | ◎ | ○ | ◎ | ○ | $(Me)_2C(OMe)-(EO)_1-(PO)_1-(EO)_1-H$ | 442 | 375 | 1.18 |
| 17 | ◎ | ○ | ◎ | ○ | $(Me)_2C(OMe)-(EO)_1-(PO)_1-(EO)_2-H$ | 548 | 449 | 1.22 |
| 18 | ◎ | ○ | ◎ | ○ | $(Me)_2C(OMe)-(EO)_1-(PO)_1-(EO)_3-H$ | 644 | 528 | 1.22 |
| 19 | ○ | ○ | ◎ | ○ | $(Me)_2C(OH)-(PO)_1-(EO)_1-(PO)_1-H$ | 416 | 382 | 1.09 |
| 20 | ○ | ○ | ◎ | ○ | $(Me)_2C(OH)-(PO)_1-(EO)_1-(PO)_2-H$ | 487 | 439 | 1.11 |
| 21 | ◎ | ○ | ○ | ○ | $(Me)_2C(OH)-(PO)_1-(EO)_2-(PO)_1-H$ | 461 | 415 | 1.11 |
| 22 | ○ | ○ | ○ | ○ | $(Me)_2C(OH)-(PO)_1-(EO)_2-(PO)_2-H$ | 552 | 493 | 1.12 |
| 23 | ○ | ○ | ◎ | ○ | $(Me)_2C(OH)-(PO)_3-(EO)_2-H$ | 608 | 511 | 1.19 |
| 24 | ◎ | ○ | ◎ | ○ | $(Me)_2C(OH)-(PO)_3-(EO)_4-H$ | 779 | 639 | 1.22 |
| Comparative Example | | | | | | | | |
| 1 | X | X | X | ○ | PO/EO = 10/90 | 4102 | 3760 | 1.09 |
| 2 | X | X | ○ | ○ | PPG with —OMe at one terminal end | 1227 | 1085 | 1.13 |
| 3 | X | X | X | ○ |  | 1100 | 982 | 1.12 |
| 4 | ○ | ○ | X | X | 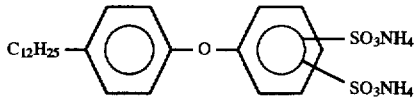 | 600 | 582 | 1.03 |

(*)GPC: Gel Permeation Chromatography

The abbreviations in Table 1 have the following meanings: PEG, polyethylene glycol; EO, polyoxyethylene; PO, polyoxypropylene; —OMe, methoxy group; —OEt, ethoxy group; —OBu, butoxy group; PPG, polypropylene glycol. The adducts listed in the "Additive Compound" column in Table 1 may be designated as follows: hexylene glycol/propylene oxide adduct (Example 1); hexylene glycol/ethylene oxide/propylene oxide adduct (Examples 13–15 and 19–24); 3-methyl-3-methoxy-butanol/propylene oxide adduct (Example 2); 3-methyl-3-methoxybutanol/ethylene oxide/propylene oxide adduct (Examples 16–18).

As is clear from Table 1, the stock developer solutions of the invention had high compatibility and the developer solutions prepared by diluting those stock developer solutions were haze-free, less prone to foam, effective in defoaming and capable of forming sharp resist patterns.

As described in detail on the foregoing pages, the stock developer solutions of the invention for photoresist development have high stability in quality, permit ease in handling and quality control. Developer solutions for photoresists can be prepared by diluting said stock developer solutions to requisite concentrations. The thus prepared developer solutions retain the characteristics of conventional products and yet they are small in the tendency to foam, effective in defoaming, assure uniform wetting and are capable of forming photoresists patterns faithful to mask patterns. Because of these advantages, the developer solutions can be circulated in developing units without interference by foaming. Additionally, the operator can make positive visual checks as to whether the developer solutions are being used and supplied in appropriate amounts and this contributes to a higher operational efficiency.

What is claimed is:

1. In a method of forming a photoresist pattern comprising the steps of applying a photoresist composition onto a substrate, drying the applied composition to form a photoresist layer, exposing the photoresist layer through a mask pattern, and developing the photoresist layer to form a photoresist pattern, the improvement wherein the photoresist layer is developed by using the developer solution for photoresist that is prepared by diluting a stock developer solution that contains a lower alkyl quaternary ammonium base in a concentration of not less than 15 wt %, and that also contains at least one surfactant having a weight average molecular weight of 200–800 selected from the group consisting of (1) an alcohol/-ethylene oxide adduct wherein the alcohol is at least one member selected from the group consisting hexylene glycol and 3-methyl-3-methoxybutyl alcohol, (2) polyethylene glycol, (3) an alcohol/propylene oxide adduct and (4) an alcohol/ethylene oxide/propylene oxide adduct.

2. A stock developer solution for photoresists that contains a lower alkyl quaternary ammonium base in a concentration of not less than 15 wt %, and that also contains at least one surfactant having a weight average molecular weight of 200–800 selected from the group consisting of (1) an alcohol/ethylene oxide adduct wherein the alcohol is at least one member selected from the group consisting of hexylene glycol and 3-methyl-3-methoxybutyl alcohol, (2) polyethylene glycol, (3) an alcohol/propylene oxide adduct and (4) an alcohol/ethylene oxide/propylene oxide adduct.

3. A stock developer solution according to claim 2 wherein the concentration of the base is not less than 20 wt %.

4. A stock developer solution according to claim 2 wherein the concentration of the base is not less than 30 wt %.

5. A stock developer solution according to claim 2 wherein said at least one surfactant a is contained in an amount of 0.06–8.4 wt %.

6. A stock developer solution according to claim 2 wherein the surfactant is the alcohol/ethylene oxide adduct or polyethylene glycol.

7. A stock developer solution according to claim 2 wherein the surfactant is the alcohol/propylene oxide adduct.

8. A stock developer solution according to claim 7 wherein the alcohol is a lower alcohol, hexylene glycol or 3-methyl-3-methoxybutyl alcohol.

9. A stock developer solution according to claim 2 wherein the surfactant is the alcohol/ethylene oxide/propylene oxide adduct.

10. A stock developer solution according to claim 9 wherein the alcohol is hexylene glycol or 3-methyl-3-methoxybutyl alcohol.

11. A developer solution for photoresists that is prepared by diluting the stock developer solution of claim 2 to a requisite concentration of the base.

12. A developer solution according to claim 11 wherein the concentration of the base is about 2–3 wt. %.

\* \* \* \* \*